(12) United States Patent
Nishida

(10) Patent No.: US 6,526,560 B1
(45) Date of Patent: Feb. 25, 2003

(54) MACRO CELL CREATING METHOD, APPARATUS AND LIBRARY THEREOF, AND RECORDING MEDIUM

(75) Inventor: Haruo Nishida, Chofu (JP)

(73) Assignee: Seiko Epson Corporation, Tokyo (JP)

( * ) Notice: Subject to any disclaimer, the term of this patent is extended or adjusted under 35 U.S.C. 154(b) by 24 days.

(21) Appl. No.: 09/666,125

(22) Filed: Sep. 20, 2000

(30) Foreign Application Priority Data

Sep. 21, 1999 (JP) .......................................... 11-267393
Sep. 20, 2000 (JP) ...................................... 2000-285328

(51) Int. Cl.[7] .............................................. G06F 17/50
(52) U.S. Cl. ............................... 716/17; 716/5; 716/8; 716/10; 716/13; 716/16
(58) Field of Search ........................................ 716/1–21

(56) References Cited

U.S. PATENT DOCUMENTS

| | | | | |
|---|---|---|---|---|
| 5,210,699 A | * | 5/1993 | Harrington ...................... | 716/5 |
| 5,224,057 A | * | 6/1993 | Igarashi et al. ................ | 716/13 |
| 5,237,514 A | * | 8/1993 | Curtin ......................... | 364/490 |
| 5,627,999 A | * | 5/1997 | Cheng et al. .................. | 716/8 |
| 5,638,292 A | * | 6/1997 | Ueda .............................. | 716/8 |
| 5,726,902 A | * | 3/1998 | Mahmood et al. ........... | 364/489 |
| 5,818,726 A | * | 10/1998 | Lee .............................. | 716/10 |
| 5,926,398 A | * | 7/1999 | Nakamura .................... | 716/10 |
| 6,026,225 A | * | 2/2000 | Iwasaki ........................ | 716/10 |
| 6,031,982 A | * | 2/2000 | Truong et al. ................ | 716/16 |

* cited by examiner

*Primary Examiner*—Matthew Smith
*Assistant Examiner*—Andrea Liu
(74) *Attorney, Agent, or Firm*—Hogan & Hartson, LLP

(57) ABSTRACT

A macro cell creating method capable of accurately calculating the delay values regarding input/output terminals of a macro cell and efficiently designing a high-speed macro cell. The macro cell creating method includes a first step for creating a frame of a macro cell based on a size estimate of a circuit, a second step for disposing provisional external input/output terminals on the frame of the macro cell based on input/output terminal information of the circuit, a third step for adding connection information of the provisional external input/output terminals with actual input/output terminals to circuit connection information, a fourth step for disposing basic function cells based on the circuit connection information, a fifth step for wiring the basic function cells, a sixth step for deleting wired lines between the provisional external input/output terminals and the actual input/output terminals, and a seventh step for creating macro cell layout data.

20 Claims, 7 Drawing Sheets

MACRO CELL CREATING METHOD, APPARATUS AND LIBRARY THEREOF, AND RECORDING MEDIUM

PRIORITY CLAIM

This patent application claims priority of Japanese Patent Application No. 11-267393, filed Sep. 21, 1999 and of Japanese Patent Application No. 2000-285328, filed Sep. 20, 2000.

BACKGROUND OF THE INVENTION

1. Field of the Invention

The present invention relates to a macro-cell-creating method, macro-cell-creating apparatus, and the like, and more particularly, to a macro-cell-creating method, comprising a basic logical circuit (hereinafter referred to as a "basic function cell") such as a NAND gate, flip-flop, inverter, and the like, in an ASIC (Application Specific Integrated Circuit) such as a gate array, standard cell, embedded array, and the like, and the macro-cell-creating apparatus and the like.

2. Description of the Related Art

Recently, an ASIC which realizes an IC (Integrated Circuit) for a specific application is actively developed. The ASIC is composed of a combination of a plurality of macro cells, each thereof being a circuit unit having a fixed function. The macro cell is composed of a combination of a plurality of basic function cells, each thereof being a basic element of a logical circuit. In recent years, with propagation of the ASIC, a circuit scale of the ASIC is rapidly increased, and a circuit scale of the macro cell, comprising the ASIC, is also increased.

On the other hand, the ASIC is required to be developed more efficiently in a shorter time. Accordingly, efficient designing of a macro cell, namely, efficient disposition and wiring of a plurality of basic function cells become important.

FIG. 6 is a flowchart showing a conventional macro-cell-creating method, and FIG. 7 is a schematic plan view showing a macro cell 600 created by the conventional macro-cell-creating method.

The macro cell 600 comprises, as shown in FIG. 7, a plurality of basic function cells such as basic function cells 611 to 613, 621 to 623, 631 to 633, and the like, and the basic function cells 611 to 613, 621 to 623, and 631 to 633 are provided with input/output terminals 641 to 649 of the macro cell 600, respectively. Furthermore, from the input/output terminals 641 to 649 of the macro cell 600, wiring lines 651 to 659 are provided for drawing out the input/output terminals 641 to 649 thereof onto the outside of the macro cell 600, respectively.

Now, a conventional macro-cell-creating method is described. As shown in FIG. 6, firstly, circuit connection information 511 showing connection states among the basic function cells, a size estimate 512 of a circuit of the desired macro cell 600, and input/output terminal information 513 of a circuit of the macro cell 600 are previously prepared, and these are stored in a storage medium or the like (step S500).

Then, based on the size estimate 512 of the circuit of the macro cell 600, a frame of the macro cell 600 is created (step S501).

Then, the circuit connection information 511 about the basic function cells included in the macro cell 600 is consulted, and all basic function cells including the basic function cells 611 to 613, 621 to 623, 631 to 633, and the like are disposed within the frame of the macro cell 600 created in step S501 (step S502).

Then, all of the basic function cells including basic function cells 611 to 613, 621 to 623, 631 to 633, and the like, disposed on the macro cell 600 in step S502, are wired (step S503).

Then, the input/output terminal information 513 of the circuit of the macro cell is consulted, then wiring lines 651 to 659 are wired for drawing out the input/output terminals 641 to 649 of the macro cell 600 created in step S503 to the outside of macro cell 600, and macro cell layout data 514 are created (step S504).

However, according to the conventional macro-cell-creating method as shown in FIG. 6, when basic function cells are disposed on a macro cell, only the circuit connection information about the basic function cells is consulted at the disposition, and accordingly the wiring for drawing out the input/output terminals of the macro cell to the outside of the macro cell becomes more complicated as well as longer, thereby causing a problem that operation speed of the macro cell is lowered.

Further, when creating a macro cell, calculation of the delay values regarding input/output terminals of the macro cell is necessitated, however, according to the conventional macro-cell-creating method, since the input/output terminals of the macro cell are drawn out to the outside of the macro cell by draw-out wiring, the delay values regarding the input/output terminals of the macro cell are to be calculated from the delay values up to the input/output terminals and the delay values of the wiring for drawing out the input/output terminals to the outside of the macro cell. Accordingly, the calculation of the delay values regarding the input/output terminals of the macro cell becomes complicated, thereby causing a problem that the accurate calculation of the delay values is difficult.

SUMMARY OF THE INVENTION

Thereupon, in view of the above-described problems, aspects of the present invention can provide a macro-cell-creating method capable of accurately calculating the delay values regarding the input/output terminals of the macro cell and capable of efficiently designing a high-speed macro cell, even if a circuit scale of the macro cell is increased.

Further, aspects of the present invention can provide a library of a macro cell layout data, capable of calculating a wiring delay time accompanied to mutual connection of the macro cells on the integrated circuit level, thereby contributing to shortening of designing time and facilitation of the designing, when an integrated circuit is designed by use of a plurality of macro cells.

Furthermore, aspects of the present invention can provide a macro-cell-creating apparatus for realizing the above described aspects.

Moreover, other aspects of the present invention can provide a recording medium which is necessitated when the macro-cell-creating method is realized by a computer.

In order to solve the above-described problems, a macro-cell-creating method is constituted as follows.

That is, the macro-cell-creating method of the present invention is a macro-cell-creating method for creating a desired macro cell based on a plurality of basic function cells respectively provided with a fixed function, and is characterized by comprising a first step for creating a frame of the macro cell based on a size estimate of the desired macro cell, a second step for disposing provisional external input/output terminals for drawing out input/output terminals of the basic function cells onto the frame of the macro cell, based on input/output terminal information of the macro cell circuit, a third step for consulting with connection information between the provisional external input/output terminals and input/output terminals of the basic function cells, in addition to circuit connection information about the basic function cells, to dispose the plurality of basic function cells inside the macro cell, and for wiring between the disposed plurality of basic function cells, and a fourth step for deleting wired lines between said provisional external input/output terminals and the input/output terminals of the basic function cells out of the wired lines.

In this way, in the macro-cell-creating methods described above, provisional external input/output terminals are previously provided on the frame of the macro cell, and the connection information of the provisional external input/output terminals is added to the circuit connection information about the basic function cells. Accordingly, the basic function cells actually having input/output terminals can be disposed at positions close to the provisional external input/output terminals.

Furthermore, in the macro-cell-creating methods described above, draw-out wiring lines connecting the input/output terminals of the basic function cells with the provisional external input/output terminals are deleted. As a result, the delay values of the draw-out wiring lines are no more required to be derived, thereby the delay values regarding the input/output of terminals of the macro cell can be accurately calculated, and further a higher-speed macro cell can be designed.

In the above-described macro-cell-creating method, the size estimate of the macro cell, the input/output terminal information of the macro cell circuit, and the circuit connection information about the basic function cells can also be previously prepared prior to the first step.

In this way, by previously preparing the size estimate of the macro cell, the input/output terminal information of the macro cell circuit, and the circuit connection information about the basic function cells, creation of the frame of the macro cell, disposition of the provisional external input/output terminals, and disposition and wiring of the basic function cells can be efficiently performed.

Further, a library can be provided as follows.

That is, a library of layout data of the macro cell created as described above, and as the layout data, at least the size of the macro cell, and the positions of the input/output terminals of the basic function cells, from which wired lines connected with the provisional external input/output terminals are deleted, are registered, and respective data thereof can be read by a computer.

Thus, when a larger scale integrated circuit is designed by utilizing a plurality of the libraries, a wiring delay time accompanied to mutual connection of the macro cells can be calculated on the integrated circuit level, thus contributing to shortening of the designing time and to facilitation of the designing.

Furthermore, macro-cell-creating apparatuses can be constituted in the following way.

That is, a macro-cell-creating apparatus for creating a desired macro cell based on a plurality of basic function cells respectively provided with a fixed function can be provided, and is characterized by comprising a frame creating means for creating a frame of the macro cell based on a size estimate of the desired macro cell, a provisional terminal disposing means for disposing provisional external input/output terminals for drawing out input/output terminals of the basic function cells onto the frame of the macro cell, based on the input/output terminal information of the macro cell circuit, a connection information adding means for adding the connection information between the provisional external input/output terminals and the input/output terminals of the basic function cells to the circuit connection information about the basic function cells, a disposing/wiring means for disposing the plurality of basic function cells inside the Afro cell based on the added circuit connection information, as well as for wiring between the disposed plurality of basic function cells, and wired line deleting means for deleting wired lines connecting the provisional external input/output terminals with the input/output terminals of the basic function cells out of the wired lines.

The above-described macro-cell-creating apparatus also can further comprise a storage means for previously storing the size estimate of the macro cell, the input/output terminal information of the macro cell circuit, and the circuit connection information about the basic function cells.

As such, the macro-cell-creating apparatus described above is previously provided with the provisional external input/output terminals on the frame of the macro cell, and the connection information of the provisional exterior input/output terminals is added to the circuit connection information about the basic function cells. As a result, the basic function cells actually having the input/output terminals can be disposed at positions close to the provisional external input/output terminals.

Further, in the macro-cell-creating method described above, draw-out wiring lines connecting the input/output terminals of the basic function cells with the provisional external input/output terminals are deleted. As a result, a delay value of the draw-out wiring is no more required to be derived, thereby the delay values regarding the input/output terminals of the macro cell can be accurately calculated, land further a higher-speed macro cell can be designed.

Moreover, a recording medium can be provided as follows.

A recording medium can be provided having recorded therein a program rendering a computer to execute the macro-cell-creating method, and capable of being read by a computer, including a first step for creating a frame of a macro cell based on a size estimate of a desired macro cell, a second step for disposing provisional external input/output terminals for drawing out input/output terminals of the basic function cells onto the macro cell frame based on input/output terminal information of the macro cell circuit, a third step for consulting with connection information between the provisional external input/output terminals and input/output terminals of the basic function cells, in addition to the circuit connection information about the basic function cells, to dispose the plurality of basic function cells inside the macro cell, and for wiring between the disposed plurality of basic function cells, and a fourth step for deleting wired lines between the provisional external input/output terminals and the input/output terminals of the basic function cells out of the wired lines.

In this way, the recording medium can have, recorded therein, a program rendering a computer to execute the macro-cell-creating method, and can be read by the computer. As a result, the macro-cell-creating method can be realized by utilizing a computer.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are. Exemplary and explanatory and are intended to provide further explanation of the invention as claimed.

DETAILED DESCRIPTION OF THE PREFERRED EMBODIMENTS

Hereinafter, the embodiments of the macro-cell-creating method and the macro-cell-creating apparatus of the present invention are described with reference to drawings.

Figure 1:
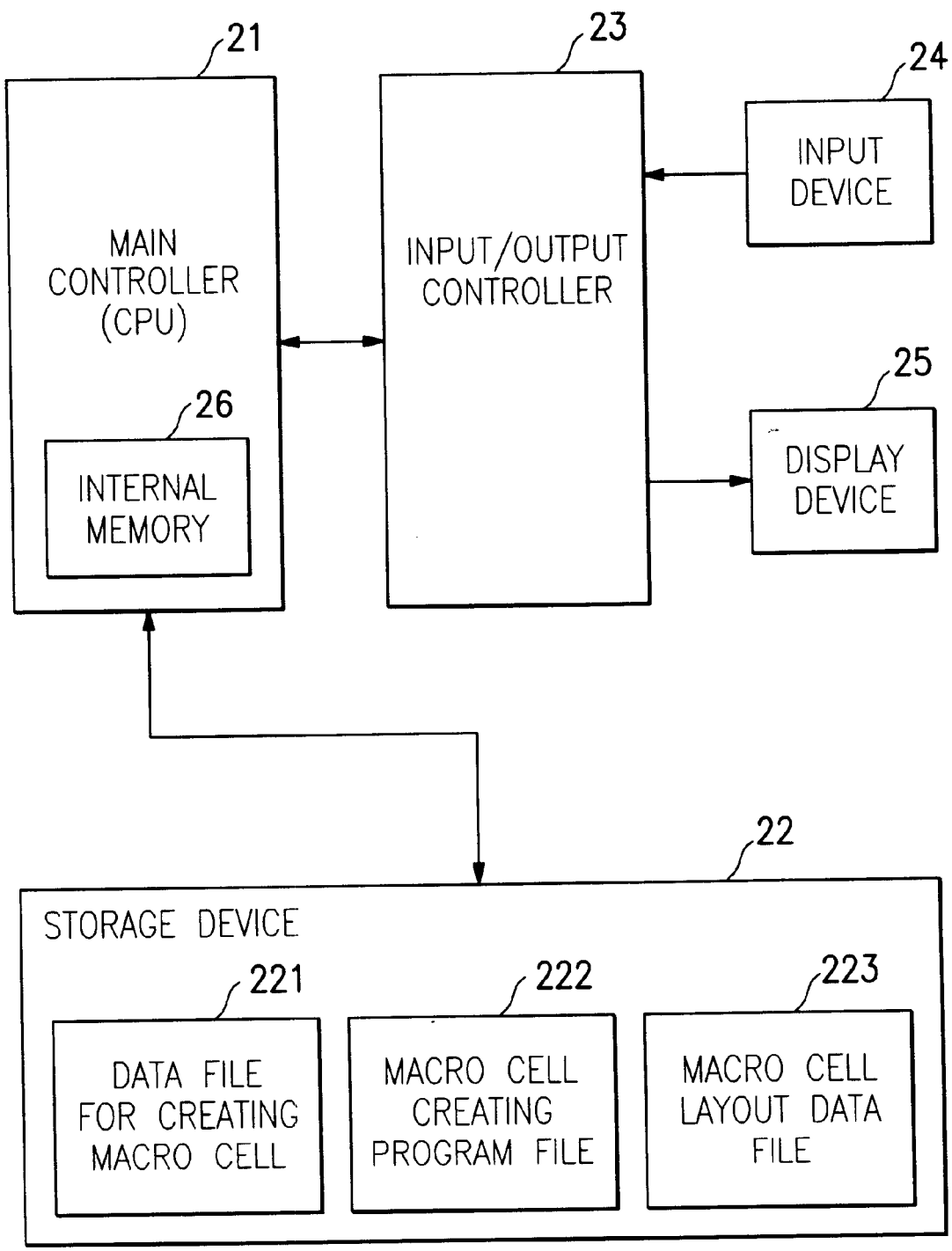
FIG. 1 is a block diagram showing a construction of an embodiment of a macro-cell-creating apparatus of the present invention.

FIG. 1 is a block diagram showing a construction of a macro-cell-creating apparatus according to the present embodiment.

The macro-cell-creating apparatus has, as shown in FIG. 1, a main controller (hereinafter referred to as a "CPU") 21 for controlling the entirety of the apparatus, and the CPU 21 is connected with a storage device 22. Further, the CPU 21 is connected with an input device 24 comprising a keyboard, mouse, and the like via an input/output controller 23, a display device 25 for displaying predetermined data when a macro cell is created, and the like.

Figure 2:
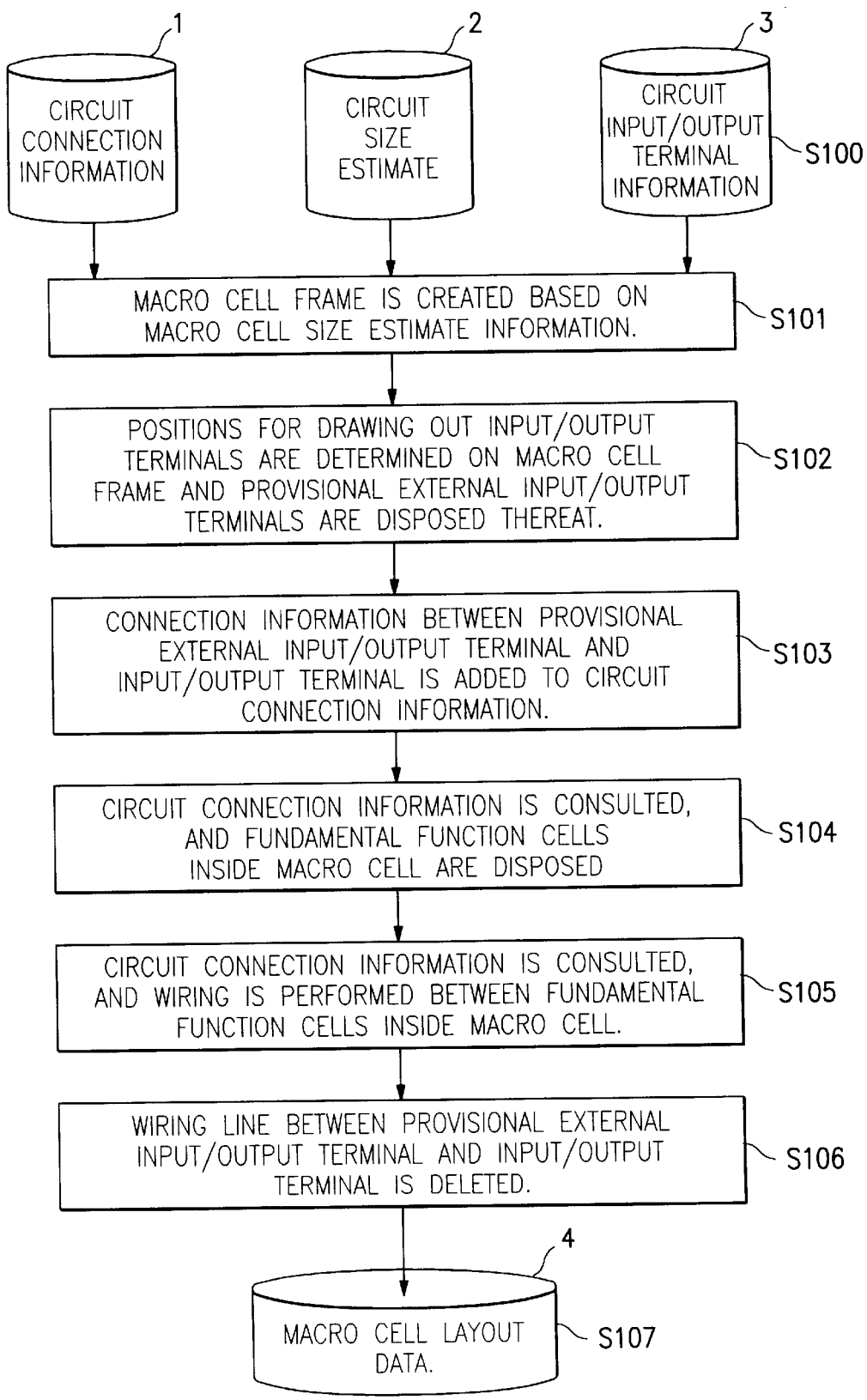
FIG. 2 is a flowchart of an embodiment of a macro-cell-creating method of the present invention.

The CPU 21 is provided with a controlling program such as an SO (operating system) or the like, a macro-cell-creating program showing a creating process of a macro cell as shown in FIG. 2, and an internal memory 26 for storing required data or the like.

The storage device 22 comprises a hard disk or flexible disk, or optical disk or the like, and stores a data file 221 for creating a macro cell, macro-cell-creating program file 222, and macro cell layout data file 223, respectively.

The data file 221 for creating the macro cell is a file for storing the circuit connection information among the basic function cells included in the macro cell, the size estimate of the macro cell circuit, and the input/output terminal information of the macro cell, respectively. The macro-cell-creating program file 222 is a file for storing the creating process (program) of the macro cell, as shown in FIG. 2. The macro cell layout data file 223 is a file (library) for storing a variety of data concerning layout of the macro cell created as later described.

Now, description is made about creation of the macro cell by the macro-cell-creating apparatus according to the present embodiment constituted as described above, with reference to a flowchart in FIG. 2.

FIG. 2 shows a process of the macro-cell-creating method according to the present embodiment, and the process is previously stored in the macro-cell-creating program file 222 to be read out to the internal memory 26 of the CPU 21 for use.

As shown in FIG. 2, firstly, in step S100, circuit connection information 1 showing connection state about the basic function cells, a size estimate 2 of the macro cell circuit, and input/output terminal information 3 of the macro cell circuit are previously prepared (step S100). As the preparation, for example, such respective information is previously stored in the data file 221 for creating the macro cell of the storage device 22 as shown in FIG. 1.

The circuit connection information 1, the size estimate 2, and the input/output terminal information 3 to be stored in the data file 221 for creating the macro cell are, for example, previously transferred to the internal memory 26 of the CPU 21.

Then, the CPU 21 creates a frame of the macro cell based on the size estimate 2 of the macro cell circuit (step S101).

Figure 3:
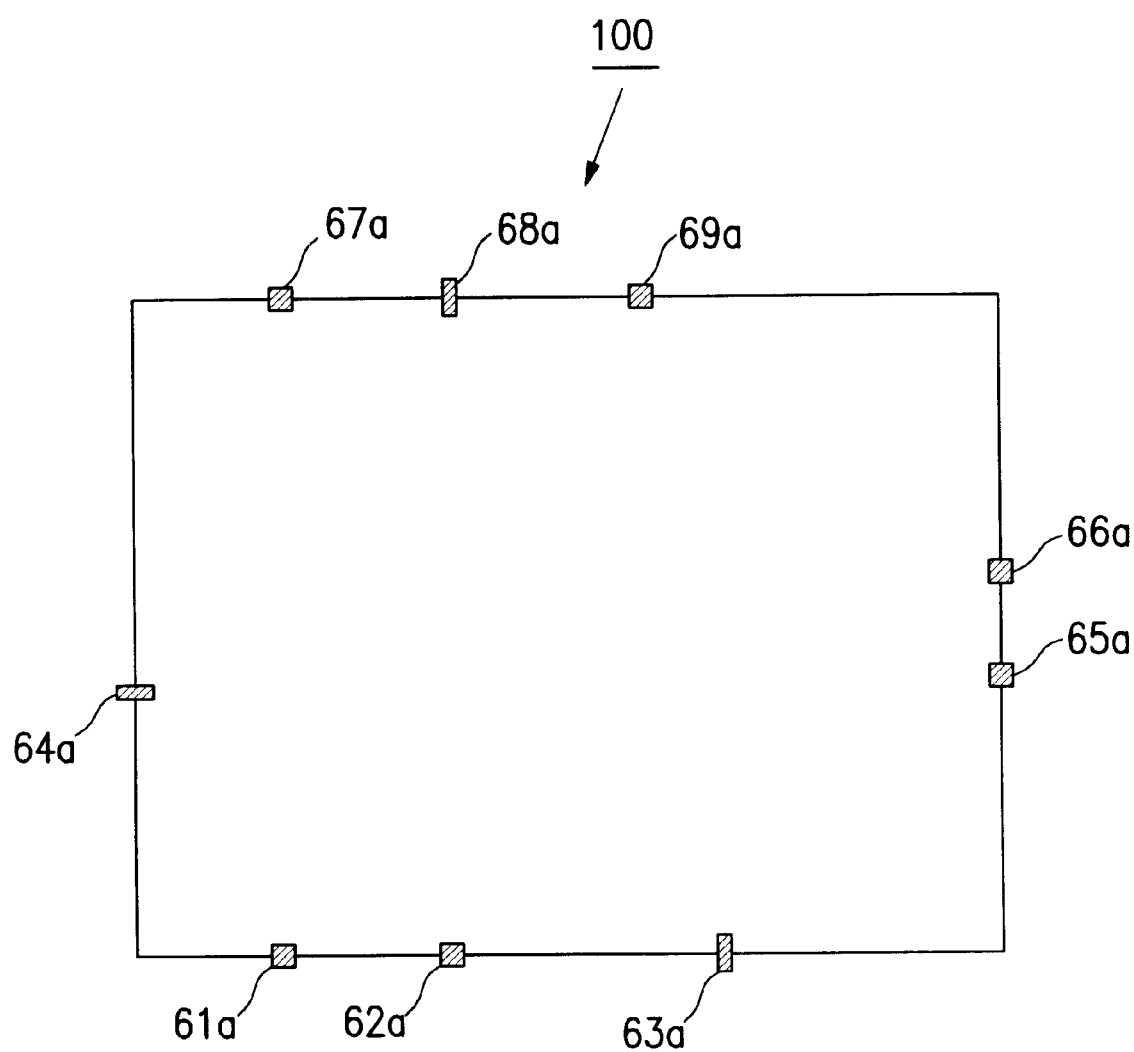
FIG. 3 is a schematic pan view of a macro cell in step S102 in FIG. 2.

Then, the CPU 21 determines positions where the input/output terminals of the macro cell are drawn out based on the input/output information 3 of the macro cell circuit, and at the determined positions, the provisional external input/output terminals 61a to 69a are disposed as shown in FIG. 3 (step S102).

FIG. 3 shows a schematic plan view of a macro cell 100 in step S102. For example, in FIG. 2, at positions on the frame of the macro cell 100, to which the input/output terminals of the macro cell 100 are drawn out, the provisional input/output terminals 61a to 69a are provided.

Then, in step S102, connection information between the provisional external input/output terminals 61a to 69a disposed on the frame of the macro cell 100 (FIG. 3) and the input/output terminals of the basic function cells is sought after, and the sought connection information is added to update the circuit connection information about the basic function cells (step S103).

Then, the updated circuit connection information 1, namely, the connection information added as described above, is consulted in addition to the intrinsic circuit connection information 1, and the basic function cells are disposed within the frame of the macro cell 100 (FIG. 3) created in step S101 (step S14).

At this disposition, since the added connection information is consulted with in addition to the intrinsic circuit connection information 1 as described above, the basic function cells having input/output terminals are disposed at the optimum layout positions, namely at positions closest to any of the provisional external input/output terminals 61a to 69a (FIG. 3).

For reference, in step S14, when the basic function cells are disposed within the frame of the macro cell 100, positions of the input/output terminals of the basic function cells are also specified.

Then, the updated circuit connection information 1 is consulted, and all of the basic function cells disposed on the macro cell 100 (FIG. 3) in step S104 are wired (step S105). The wiring is for between input/output terminals of all disposed basic function cells, and includes wiring of the provisional external input/output terminals 61a to 69a with the input/output terminals of the basic function cells.

Figure 4:
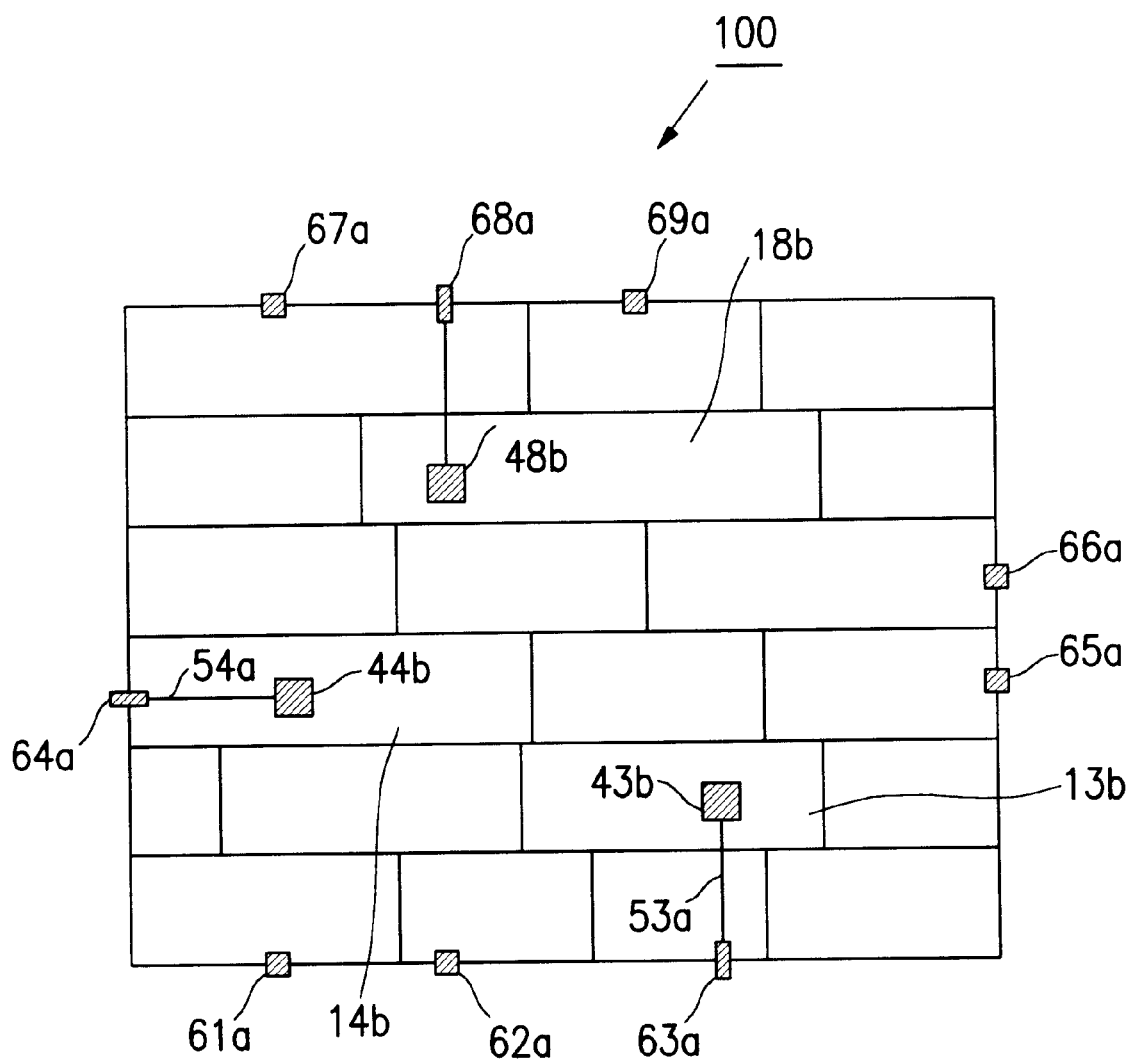
FIG. 4 is a schematic plan view of a macro cell in steps S104 and S105 in FIG. 2.

FIG. 4 shows a schematic plan view of the macro cell 100 in steps S104 and S105. For example, in FIG. 4, all basic function cells of the macro cell 100 are disposed on the macro cell 100. Here, three basic function cells 13b, 14b, and 18b have actual input/output terminals 43b, 44b, and 48b.

As shown in FIG. 4, the macro cell 100 is provided with the actual input/output cells 43b, 44b, and 48b, the provisional input/output terminals 63a, 64a, and 68a, and wiring lines 53a, 54a, and 58a connecting therebetween, respectively.

Lastly, of the wiring in step S105, the wiring line 53a, 54a, and 58a (FIG. 4) connecting the actual input/output terminals 43b, 44b, and 48b (FIG. 4), respectively, with the provisional external input/output terminals 63a, 64a, and 68a (FIG. 4) of the macro cell 100 (FIG. 4) are deleted (step S106), and macro cell layout data 4 regarding the completed macro cell are created (step S107).

Here, the macro cell layout data 4 to be created include data of the size of the completed macro cell, data of respective positions of the actual input/output terminals 43b, 44b, and 48b of the macro cell 100 (FIG. 4) from which wiring lines 53a, 54a, and 58a connected with the provisional external input/output terminals 63a, 64a, and 68a are deleted, and wiring data between the basic function cells, and the like. The macro cell layout data 4 are registered in the macro cell layout data file 223 of the storage device 22 shown in FIG. 1.

Figure 5:
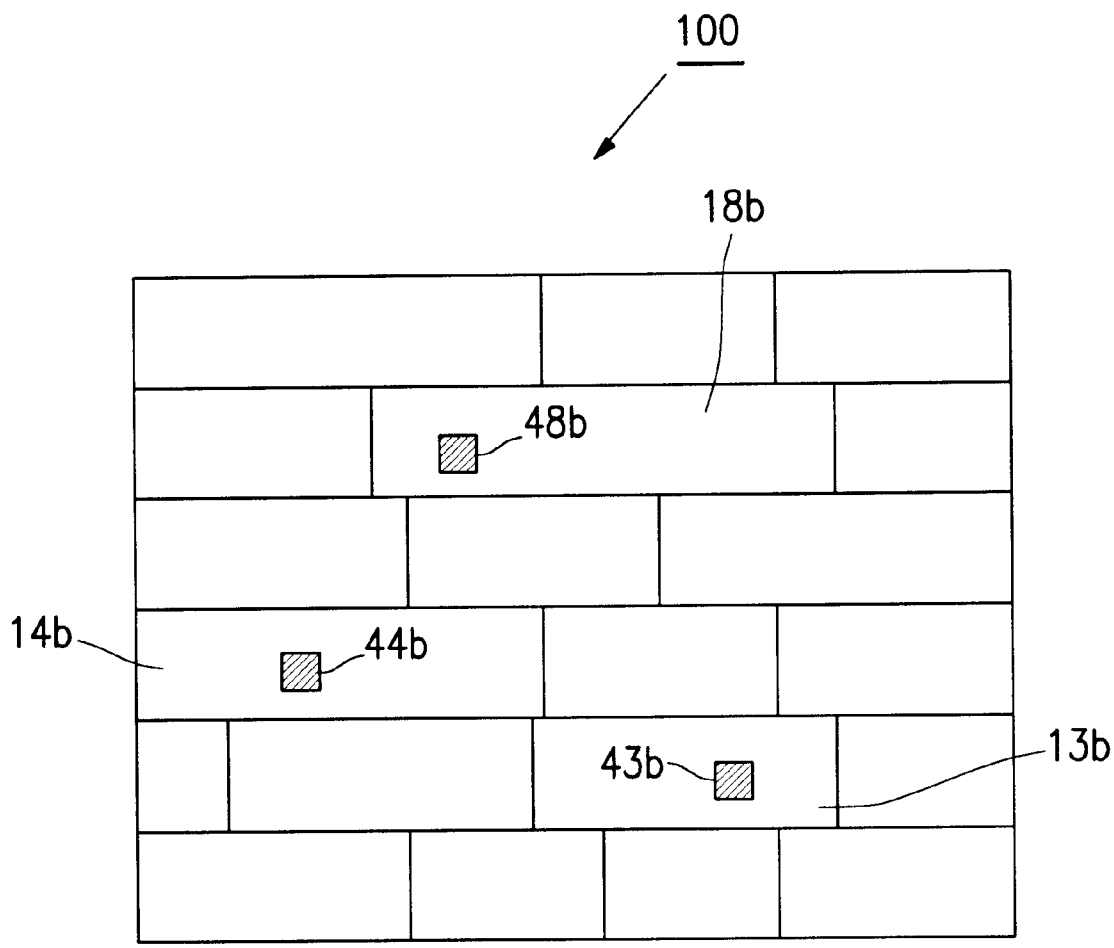
FIG. 5 shows a schematic view showing a macro cell finally created.
Figure 6:
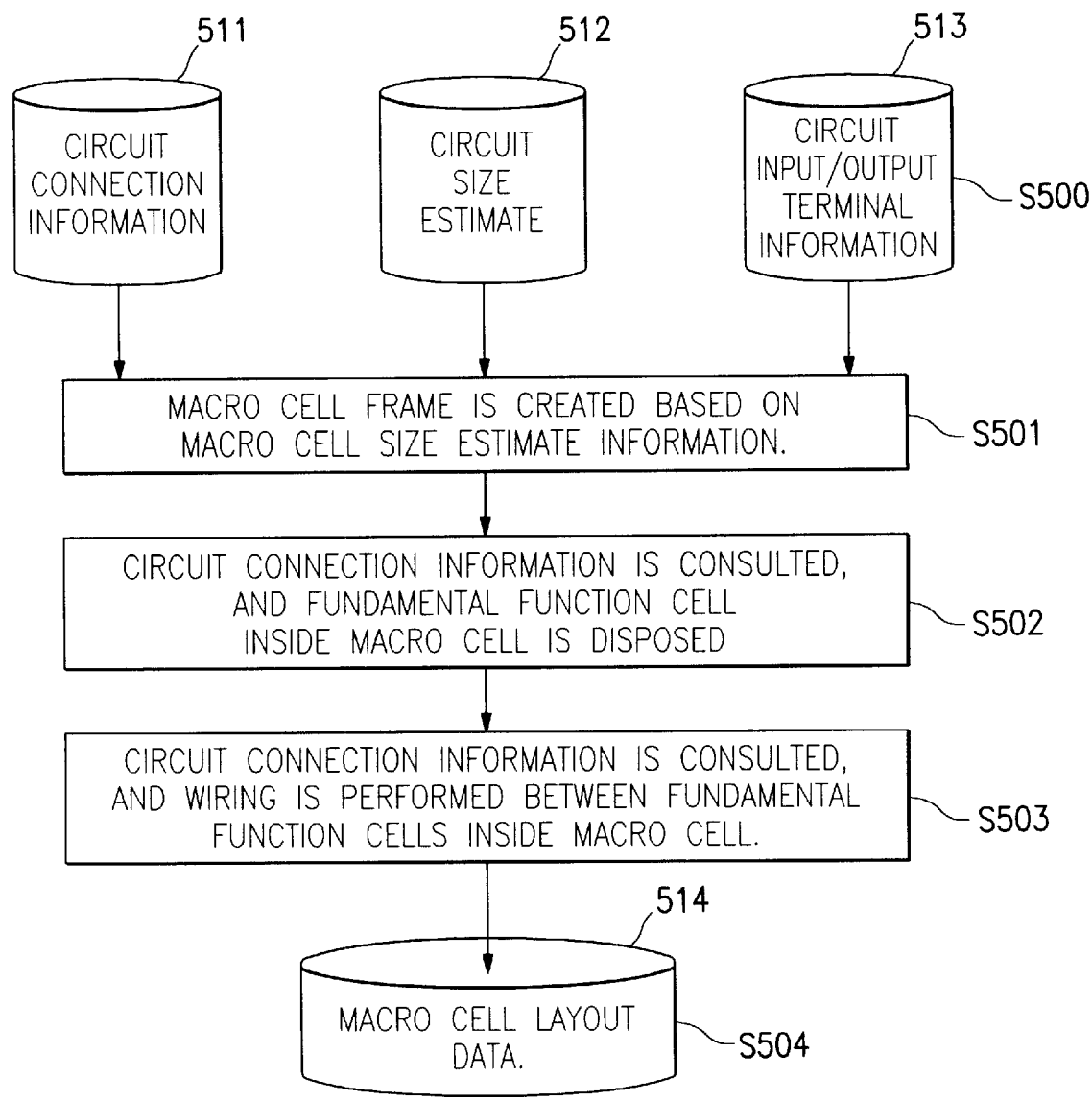
FIG. 6 is a flowchart showing a conventional macro-cell-creating method.
Figure 7:
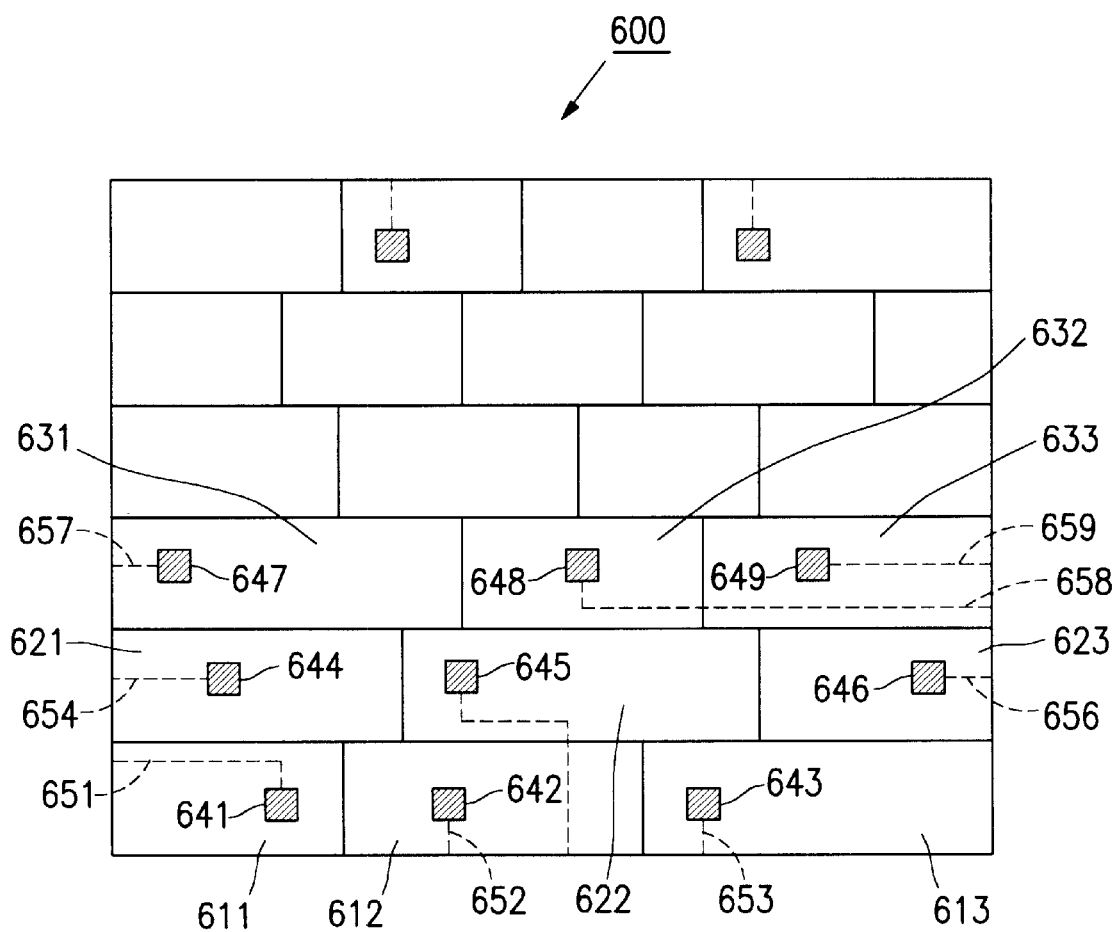
FIG. 7 is a schematic plan view showing a conventional macro cell.

FIG. 5 shows a macro cell to be created by information stored in the macro cell layout data 4. As shown in FIG. 5, in the macro cell 100, draw-out wiring lines directing toward the outside of the macro cell 100 from the input/output terminals 43b, 44b, and 48b of the basic function cells 13b, 14b, and 18b are deleted.

As described above, provisional external input/output terminals are previously provided on the outside of the macro cell, and connection information of the provisional external input/output terminals with the input/output terminals of the basic function cells is added to the circuit connection information. As a result, the basic function cells having the actual input/output terminals are automatically disposed at positions close to the outside of the macro cell.

Furthermore, draw-out wiring lines connecting the input/output terminals of the basic function cells with the provisional external input/output terminals are deleted. As a result, the delay values of the draw-out wiring lines are no more required to be derived, and further a higher-speed macro cell can be designed.

For reference, the frame-creating means can correspond to step S101 of FIG. 2. the provisional terminal-disposing means can correspond to step S102 of FIG. 2, and the connection-information-adding means thereof can correspond to step S103 of FIG. 2. Further, the disposing/wiring means thereof can correspond to steps S104 and 105 in FIG. 2, and the wired-line-deleting means thereof can correspond to step S106 of FIG. 2.

The macro cell layout data 4 obtained by the above-described embodiment can be stored in the macro cell layout data file 223 of the storage device 22 shown in FIG. 1, respectively, of the completed macro cells. Since a large-scale integrated circuit can be designed by utilizing the stored macro cell layout data 4, the largescale integrated circuit is now described.

When the integrated circuit is designed, the wiring delay time accompanied to mutual connection of the input/output terminals of a macro cell can be calculated on the integrated circuit level by use of data of the positions of the actual input/output terminals (refer to FIG. 5) of respective macro cells, and this can contribute to shortening of the designing time and facilitation of the designing of the integrated circuit.

Further, when the input/output terminals of a macro cell are mutually connected, an unused region of a wiring line deleted in step S106 of FIG. 2 can be utilized, and by utilizing the unused region for wiring, the wiring can be reasonably performed.

As described above, provisional external input/output terminals are previously provided on the frame of the macro cell, and the connecting information of the provisional external input/output terminals is added to the circuit connection information about the basic function cells. As a result, basic function cells respectively having an actual input/output terminal can be disposed at positions close to the provisional external input/output terminals.

Further, draw-out wiring lines connecting the input/output terminals of the basic function cells with the provisional external input/output terminals are made to be deleted. As a result, the delay values of draw-out wiring lines are no more required to be derived, thereby the delay values regarding the input/output terminals of the macro cell can be accurately calculated, and further a higher-speed micro cell can be designed.

Furthermore, according to the library described above, when a larger-scale integrated circuit is designed utilizing a plurality of the libraries, the wiring delay time accompanied to mutual connection of the macro cells can be calculated on the integrated circuit level, and this can contribute to shortening of the designing time and facilitation of the designing.

Moreover, the recording medium can have a record recorded therein of a program for rendering a computer to execute the macro-cell-creating method, and the record can be read by the computer. As a result, the macro-cell-creating methods described above can be realized by use of the computer.

It will be apparent to those skilled in the art that various modifications and variations can be made in the macro cell creating method of the present invention without departing from the spirit or scope of the inventions. Thus, it is intended that the present invention cover modifications and variations of this invention that come within the scope of the appended claims and their equivalents.

What is claimed is:

1. A macro-cell-creating method for creating a desired macro cell based on a plurality of basic function cells each respectively provided with a fixed function, comprising:

(a) creating a frame of the macro cell based on a size estimate of the desired macro cell;

(b) disposing provisional external input/output terminals onto said macro cell frame for drawing out input/output terminals of said basic function cells onto said macro cell frame, based on input/output terminal information of said macro cell circuit;

(c) consulting with connection information between said provisional external input/output terminals and input/output terminals of said basic function cells, in addition to circuit connection information about said basic function cells, to dispose said plurality of basic function cells inside said macro cell, and for wiring between said disposed plurality of basic function cells; and (d) deleting wired lines between said provisional external input/output terminals and said input/output terminals of said basic function cells out of said wired lines.

2. A macro-cell-creating method as claimed in claim 1, wherein the size estimate of said macro cell, the input/output terminal information of said macro cell circuit, and the circuit connection information about said basic function cells are previously prepared prior to step (a).

3. A library of layout data of a macro cell created in the macro-cell-creating method for creating a desired macro cell based on a plurality of basic function cells each respectively provided with a fixed function, comprising:

(a) creating a frame of the macro cell based on a size estimate of the desired macro cell;

(b) disposing provisional external input/output terminals onto said macro cell frame for drawing out input/output terminals of said basic function cells onto said macro cell frame, based on input/output terminal information of said macro cell circuit;

(c) consulting with connection information between said provisional external input/output terminals and input/output terminals of said basic function cells, in addition to circuit connection information about said basic function cells, to dispose said plurality of basic function cells inside said macro cell, and for wiring between said disposed plurality of basic function cells; and (d) deleting wired lines between said provisional external input/output terminals and said input/output terminals of said basic function cells out of said wired lines, wherein the size of said macro cell, and positions of said input/output terminals of said basic function cells, in which wired lines with said provisional external input/output terminals are deleted, are at least registered therein as said layout data, and respective data thereof can be read by a computer.

4. A macro-cell-creating apparatus for creating a desired macro cell based on a plurality of basic function cells each provided with a fixed function, comprising:

a frame creating means for creating a frame of the macro cell based on a size estimate of the desired macro cell;

a provisional terminal-disposing means for disposing provisional external input/output terminals onto said macro cell frame for drawing out input/output terminals of said basic function cells onto the frame of said macro cell, based on input/output terminal information of a circuit of said macro cell;

a connection information adding means for adding connection information between said provisional external input/output terminals and input/output terminals of said basic function cells to circuit connection information about said basic function cells;

a disposing/wiring means for disposing said plurality of basic function cells inside said macro cell based on said added circuit connection information, as well as for wiring between said disposed plurality of basic function cells; and a wired line deleting means for deleting wired lines between said provisional external input/output terminals and said input/output terminals of said basic function cells out of said wiring.

5. A macro-cell-creating apparatus as claimed in claim 4, further comprising storage means for previously storing the size estimate of said macro cell, the input/output terminal information of said macro cell, the input/output terminal information of said macro cell circuit, and the circuit connection information about said basic function cells.

6. A macro-cell-creating apparatus as claimed in claim 4, further comprising storage means for previously storing the size of said macro cell, and positions of said input/output terminals of said basic function cells, in which wired lines with said provisional external input/output terminals are deleted, are at least registered therein as said layout data, and respective data thereof can be read by a computer.

7. A recording medium capable of being read by a computer having a program recorded therein for rendering the computer to execute a macro-cell-creating method, comprising:

(a) creating a frame of the macro cell based on a size estimate of a desired macro cell;

(b) disposing provisional external input/output terminals onto said macro cell frame for drawing out input/output terminal of said basic function cells onto said macro cell frame, based on input/output terminal information of said macro cell circuit;

(c) consulting with connection information between said provisional external input/output terminals and input/output terminals of said basic function cells, in addition to circuit connection information about said basic function cells, to dispose said plurality of basic function cells inside said macro cell, and for wiring between said disposed plurality of basic function cells; and (d) deleting wired lines between said provisional external input/output terminals and said input/output terminals of said basic function cells out of said wiring.

8. A recording medium as claimed in claim 7, wherein the size estimate of said macro cell, the input/output terminal information of said macro cell circuit, and the circuit connection information about said basic function cells are previously prepared prior to step (a).

9. A recording medium as claimed in claim 7, wherein the size of said macro cell, and positions of said input/output terminals of said basic function cells, in which wired lines with said provisional external input/output terminals are deleted, are at least registered therein as said layout data, and respective data thereof can be read by a computer.

10. A method of creating a macro-cell circuit comprising a plurality of basic function cells, comprising:

providing circuit connection information for the plurality of basic function cells, size estimate information for the macro cell circuit, and input/output terminal information for the macro cell circuit;

creating a frame of the macro cell circuit based on the size estimate information for the macro cell circuit;

using the input/output information of the macro cell circuit to determine provisional positions on the frame to which the input/output terminals of the macro cell circuit are to be drawn out;

providing provisional external input/output terminals at the provisional positions on the frame;

determining other connection information between the provisional external input/output terminals and the input/output terminals of the basic function cells;

adding the other connection information to the circuit connection information for the basic function cells to provide updated circuit connection information for the basic function cells;

consulting the updated circuit connection information;

disposing the basic function cells within the frame of the macro cell circuit, based on the updated circuit connection information, such that input/output terminals of the basic function cells are disposed at positions closest to the provisional external input/output terminals;

electrically connecting the input/output terminals of the basic function cells to the provisional external input/output terminals; and deleting the wiring lines to thereby create macro cell layout data for the completed macro cell.

11. A method of creating a macro-cell circuit as claimed in claim 10, wherein the circuit connection information for the plurality of basic function cells includes connection states of basic function cells.

12. A method of creating a macro-cell circuit as claimed in claim 10, wherein consulting the updated circuit connection information comprises:
consulting the updated circuit connection information that includes both the other connection information and the circuit connection information for the basic function cells.

13. A method of creating a macro-cell circuit as claimed in claim 10, wherein disposing the basic function cells within the frame of the macro cell circuit, based on the updated circuit connection information, comprises:
disposing the basic function cells within the frame of the macro cell circuit, based on the updated circuit connection information, such that input/output terminals of the basic function cells are disposed at positions closest to any of the provisional external input/output terminals, and
wherein positions of the input/output terminals of the basic function cells are also specified.

14. A method of creating a macro-cell circuit as claimed in claim 10, wherein electrically connecting the input/output terminals of the basic function cells to the provisional external input/output terminals, comprises:
providing wiring between input/output terminals of the basic function cells to the provisional external input/output terminals based on the updated circuit connection information.

15. A method of creating a macro-cell circuit as claimed in claim 10, wherein electrically connecting the input/output terminals of the basic function cells to the provisional external input/output terminals, comprises:
electrically connecting actual input/output cells of the macro cell circuit to the provisional input/output terminals via wiring lines.

16. A method of creating a macro-cell circuit as claimed in claim 10, wherein deleting the wiring lines to thereby create macro cell layout data for the completed macro cell, comprises:
deleting the wiring lines connecting the input/output terminals of the basic function cells to the provisional external input/output terminals to thereby create macro cell layout data for the completed macro cell.

17. A method of creating a macro-cell circuit as claimed in claim 10, wherein the macro cell layout data comprises:
data of the size of the completed macro cell;
data of respective positions of the input/output terminals of the macro cell from which wiring lines connected with the provisional external input/output terminals are deleted; and
wiring data between the basic function cells.

18. A method of creating a macro-cell circuit comprising a plurality of basic function cells, comprising:
providing circuit connection information for the plurality of basic function cells, size estimate information for the macro cell circuit, and input/output terminal information for the macro cell circuit;
creating a frame of the macro cell circuit based on the size estimate information for the macro cell circuit;
providing provisional external input/output terminals at provisional positions on the frame to which the input/output terminals of the macro cell circuit are to be drawn out, wherein the provisional positions on the frame are determined using the input/output information of the macro cell circuit;
adding other connection information to the circuit connection information for the basic function cells to provide updated circuit connection information for the basic function cells, wherein the other connection information is determined based on the provisional external input/output terminals and the input/output terminals of the basic function cells;
disposing the basic function cells within the frame of the macro cell circuit, based on the updated circuit connection information, such that input/output terminals of the basic function cells are disposed at positions adjacent the provisional external input/output terminals;
electrically connecting the input/output terminals of the basic function cells to the provisional external input/output terminals; and
deleting the wiring lines to thereby create macro cell layout data for the completed macro cell.

19. A macro-cell-creating apparatus for creating a macro cell circuit comprising a plurality of basic function cells, comprising:
a database including circuit connection information for the plurality of basic function cells, size estimate information for the macro cell circuit, and input/output terminal information for the macro cell circuit; and
a processor, comprising:
means for creating a frame of the macro cell circuit based on the size estimate information for the macro cell circuit;
means for providing provisional external input/output terminals at provisional positions on the frame to which the input/output terminals of the macro cell circuit are to be drawn out, wherein the provisional positions on the frame are determined using the input/output information of the macro cell circuit;
means for adding other connection information to the circuit connection information for the basic function cells to provide updated circuit connection information for the basic function cells, wherein the other connection information is determined based on the provisional external input/output terminals and the input/output terminals of the basic function cells;
means for disposing the basic function cells within the frame of the macro cell circuit, based on the updated circuit connection information, such that input/output terminals of the basic function cells are disposed at positions adjacent the provisional external input/output terminals;
means for electrically connecting the input/output terminals of the basic function cells to the provisional external input/output terminals; and
means for deleting the wiring lines to thereby create macro cell layout data for the completed macro cell circuit.

20. A method of creating a macro-cell circuit comprising a plurality of basic function cells, comprising:
creating a frame of the macro cell based on a size estimate of the desired macro cell;

disposing provisional external input/output terminals onto said macro cell frame for drawing out input/output terminals of said basic function cells onto the frame of said macro cell, based on input/output terminal information of a circuit of said macro cell;

adding connection information between said provisional external input/output terminals and input/output terminals of said basic function cells to circuit connection information about said basic function cells;

disposing said plurality of basic function cells inside said macro cell based on said added circuit connection information, as well as for wiring between said disposed plurality of basic function cells; and deleting wired lines between said provisional external input/output terminals and said input/output terminals of said basic function cells out of said wiring.

* * * * *